United States Patent
Kim

(10) Patent No.: US 8,854,565 B2
(45) Date of Patent: Oct. 7, 2014

(54) METHOD OF FABRICATING LIQUID CRYSTAL DISPLAY DEVICE

(75) Inventor: Hyo-Uk Kim, Gumi-si (KR)

(73) Assignee: LG Display Co., Ltd., Seoul (KR)

( * ) Notice: Subject to any disclaimer, the term of this patent is extended or adjusted under 35 U.S.C. 154(b) by 1775 days.

(21) Appl. No.: 11/819,825

(22) Filed: Jun. 29, 2007

(65) Prior Publication Data

US 2008/0014665 A1   Jan. 17, 2008

(30) Foreign Application Priority Data

Jun. 30, 2006  (KR) .................. 10-2006-0060863

(51) Int. Cl.
*G02F 1/136* (2006.01)
*G02F 1/1333* (2006.01)
*H01L 27/12* (2006.01)

(52) U.S. Cl.
CPC .................. *H01L 27/1214* (2013.01)
USPC .......................... 349/43; 349/138

(58) Field of Classification Search
USPC ............................ 349/42, 43, 138
See application file for complete search history.

(56) References Cited

U.S. PATENT DOCUMENTS

| | | | |
|---|---|---|---|
| 2002/0117691 A1* | 8/2002 | Choi et al. ............... | 257/225 |
| 2005/0270453 A1* | 12/2005 | Jung et al. ............... | 349/114 |
| 2006/0008952 A1* | 1/2006 | Wu et al. ................. | 438/149 |
| 2006/0256247 A1* | 11/2006 | Hirai et al. .............. | 349/42 |
| 2006/0275710 A1* | 12/2006 | Yamazaki et al. ...... | 430/313 |
| 2007/0158025 A1* | 7/2007 | Larson ................... | 156/345.26 |

* cited by examiner

*Primary Examiner* — Jessica M Merlin
(74) *Attorney, Agent, or Firm* — Morgan, Lewis & Bockius LLP

(57) ABSTRACT

A method of fabricating a liquid crystal display device includes the steps of forming a gate electrode and a gate line on a first substrate, forming a gate insulating layer on the gate electrode, forming an active layer on the gate insulating layer and an ohmic contact layer on the active layer, forming source and drain electrodes spaced apart from each other and on the ohmic contact layer, forming a data line that crosses the gate line, etching a portion of the ohmic contact layer between the source and drain electrodes in a chamber of a dry-etching device to expose a portion of the active layer, forming a passivation layer on the first substrate which remains in the chamber, the passivation layer covering the portion of the active layer, forming a pixel electrode connected to the drain electrode, and interposing a liquid crystal layer between the pixel electrode and a second substrate.

17 Claims, 16 Drawing Sheets

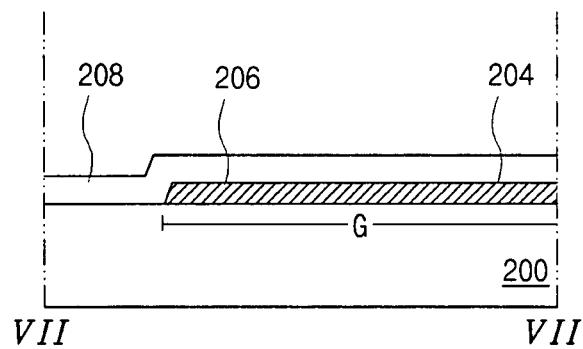
FIG. 7E
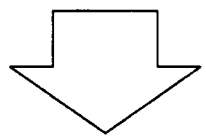
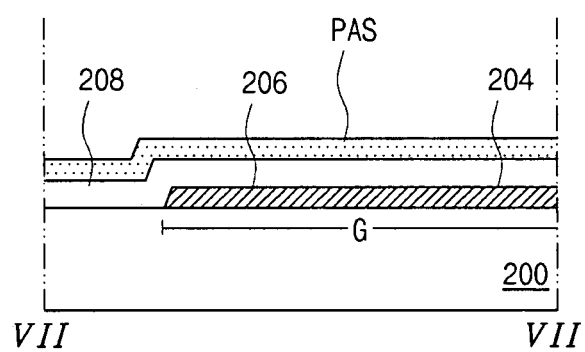
FIG. 7F
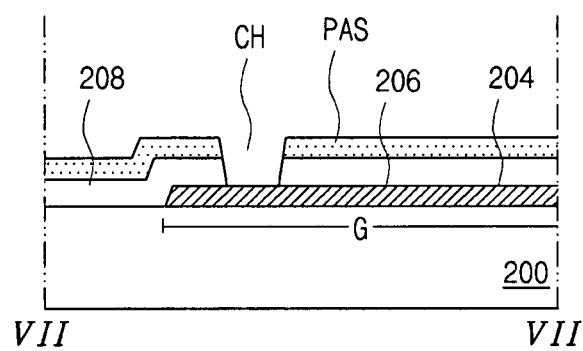

METHOD OF FABRICATING LIQUID CRYSTAL DISPLAY DEVICE

The present invention claims the benefit of Korean Patent Application No. 2006-0060863, filed in Korea on Jun. 30, 2006, which is hereby incorporated by reference.

BACKGROUND OF THE INVENTION

1. Field of the Invention

The present invention relates to a liquid crystal display device, and more particularly, to a method of fabricating a liquid crystal display (LCD) device.

2. Discussion of the Related Art

Until recently, display devices have typically used cathode-ray tubes (CRTs). Presently, many efforts and studies are being made to develop various types of flat panel displays, such as liquid crystal display (LCD) devices, plasma display panels (PDPs), field emission displays, and electro-luminescence displays (ELDs), as a substitute for CRTs. Of these flat panel displays, LCD devices have many advantages, such as high resolution, light weight, thin profile, compact size, and low voltage power supply requirements.

In general, an LCD device includes two substrates that are spaced apart and face each other with a liquid crystal material interposed between the two substrates. The two substrates include electrodes that face each other such that a voltage applied between the electrodes induces an electric field across the liquid crystal material. Alignment of the liquid crystal molecules in the liquid crystal material changes in accordance with the intensity of the induced electric field into the direction of the induced electric field, thereby changing the light transmissivity of the LCD device. Thus, the LCD device displays images by varying the intensity of the induced electric field.

FIG. 1 is a perspective view illustrating an LCD device according to the related art. Referring to FIG. 1, the LCD device 3 includes an array substrate 22, a color filter substrate 5, and a liquid crystal layer 11 between the two substrates.

The array substrate 22 includes gate lines 12 and data lines 24 crossing each other to define a pixel region P on a first substrate 22. A thin film transistor T is located at a crossing of gate line 12 and data line 24. The thin film transistor T includes a gate electrode 30, a semiconductor layer 32, a source electrode 34, and a drain electrode 36. A pixel electrode 17 is disposed in the pixel region P and connected to the drain electrode 36.

The color filter substrate 5 includes red (R), green (G), and blue (B) color filter patterns 7a, 7b, and 7c in respective pixel regions P and a black matrix 6 between the color filter patterns 7a, 7b, and 7c on the color filter substrate 5. A common electrode 9 is disposed on the color filter patterns 7a, 7b, and 7c.

When voltages are applied to the pixel electrode 17 and common electrode 9, an electric field is induced. The liquid crystal molecules are arranged by the induced electric field, and the light transmissivity of the LCD device 3 is changed. Thus, images are displayed.

The thin film transistors may have various types, for example, an inverted staggered type. FIG. 2 is a cross-sectional view illustrating an LCD device having an inverted staggered type thin film transistor according to the related art. Referring to FIG. 2, the inverted staggered type thin film transistor T includes a gate electrode 52 on a substrate 50, a semiconductor layer 56 over the gate electrode 52, and source and drain electrodes 60 and 62 on the semiconductor layer 56. The semiconductor layer 56 has an active layer 57 and an ohmic contact layer 58. A passivation layer 64 is on the thin film transistor T, and a pixel electrode 68 is on the passivation layer 64 such that the pixel electrode 68 contacts the drain electrode 62 through a drain contact hole 66.

FIGS. 3A to 3E are cross-sectional views illustrating a method of fabricating an array substrate having an inverted staggered type thin film transistor according to the related art. Referring to FIG. 3A, a metallic material is deposited on a substrate 50 and patterned to form a gate electrode 52 and a gate line (not shown). A gate insulating layer 54 is formed on the substrate 50 having the gate electrode 52. Referring to FIG. 3B, an intrinsic amorphous silicon layer and an impurity-doped amorphous silicon layer are formed on the gate insulating layer 54 and patterned to form an active layer 57 and an ohmic contact layer 58. Referring to FIG. 3C, a metallic material is deposited on the substrate 50 having the active layer 57 and the ohmic contact layer 58 and patterned to form source electrode 60 and drain electrode 62, and a data line (not shown). A portion of the ohmic contact layer 58 exposed between the source and drain electrodes 60 and 62 is removed and a portion of the active layer 57 (i.e., a channel portion) is exposed. Referring to FIG. 3D, a passivation layer 64 is formed on the substrate 50 having the source and drain electrodes 60 and 62. The passivation layer 64 is patterned to form a drain contact hole 66 exposing the drain electrode 62. Referring to FIG. 3E, a transparent conductive layer is formed on the passivation layer 64 and patterned to form a pixel electrode 68 contacting the drain electrode 62.

As described above, the gate electrode 52 and the gate line (not shown) are formed in a first mask process, the active layer 57 and the ohmic contact layer 58 are formed in a second mask process, the source and drain electrodes 60 and 62 and the data line (not shown) are formed in a third mask process, the passivation layer 64 having the drain contact hole 66 is formed in a fourth mask process, and the pixel electrode 68 is formed in a fifth mask process. Through the above five mask processes, the array substrate 22 is fabricated.

In each of the above mask processes, processes of forming a layer on a substrate in a chamber, forming a photoresist layer on the layer, light-exposing the photoresist layer using a mask, and stripping the photoresist layer to form a photoresist pattern, etching the layer using the photoresist pattern, cleaning the substrate, and so on are conducted.

After the process of forming the layer in the chamber, the substrate may come out of the chamber for the other processes and be exposed to an external condition. When the substrate is exposed, an exposed portion of the substrate may be contaminated by external particles. In particular, when the channel portion is exposed and contaminated, leakage current may be caused through a contaminated surface of the channel portion. Accordingly, the thin film transistor operates abnormally to cause blurring, and reliability is reduced.

SUMMARY OF THE INVENTION

Accordingly, the present invention is directed to a method of fabricating a liquid crystal display device that substantially obviates one or more of the problems due to limitations and disadvantages of the related art.

An object of the present invention is to provide a method of fabricating a liquid crystal display device that can improve reliability.

Additional features and advantages of the present invention will be set forth in the description which follows, and in part will be apparent from the description, or may be learned by practice of the invention. These and other advantages of the invention will be realized and attained by the structure particularly pointed out in the written description and claims hereof as well as the appended drawings.

To achieve these and other advantages and in accordance with the purpose of the present invention, as embodied and broadly described herein, a method of fabricating a liquid crystal display device includes the steps of forming a gate electrode and a gate line on a first substrate, forming a gate insulating layer on the gate electrode, forming an active layer on the gate insulating layer and an ohmic contact layer on the active layer, forming source and drain electrodes spaced apart from each other and on the ohmic contact layer, forming a data line that crosses the gate line, etching a portion of the ohmic contact layer between the source and drain electrodes in a chamber of a dry-etching device to expose a portion of the active layer, forming a passivation layer on the first substrate which remains in the chamber, the passivation layer covering the portion of the active layer, forming a pixel electrode connected to the drain electrode, and interposing a liquid crystal layer between the pixel electrode and a second substrate.

In another aspect, a method of fabricating a liquid crystal display device, includes the steps of forming a gate line and a data line crossing each other to define a pixel region on an array substrate, forming a thin film transistor on the array substrate connected to the gate line and the data line and including a gate electrode, an active layer over the gate electrode, an ohmic contact layer on the active layer, and source and drain electrodes on the ohmic contact layer, wherein a portion of the ohmic contact layer between the source and drain electrodes is etched in a chamber of a dry-etching device to expose a portion of the active layer, forming a passivation layer on the array substrate which remains in the chamber, the passivation layer covering the portion of the active layer, forming a pixel electrode in the pixel region, and attaching the array substrate and an opposing substrate with a liquid crystal layer between the array substrate and the opposing substrate.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings:

FIGS. 7A to 7G are cross-sectional views, taken along line VII-VII of FIG. 5 illustrating a method of fabricating the array substrate.

DETAILED DESCRIPTION OF THE ILLUSTRATED EMBODIMENTS

Reference will now be made in detail to illustrated embodiments of the present invention, which are illustrated in the accompanying drawings.

Figure 1:
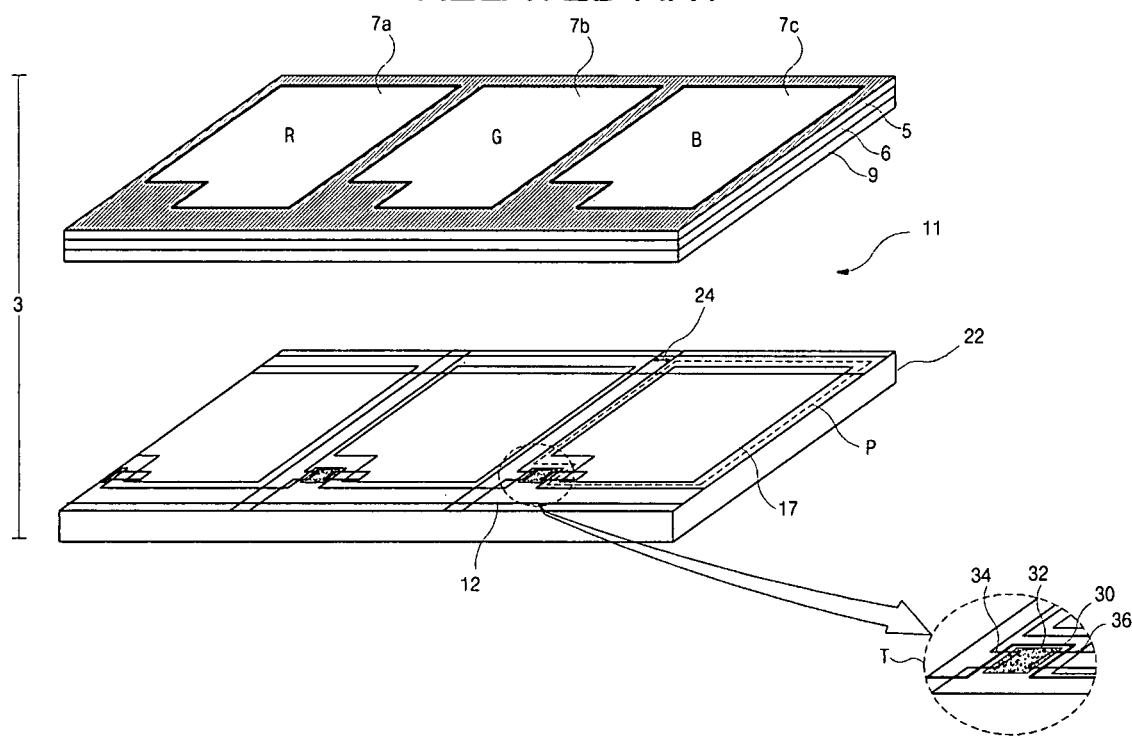
FIG. 1 is a perspective view illustrating an LCD device according to the related art.
Figure 2:
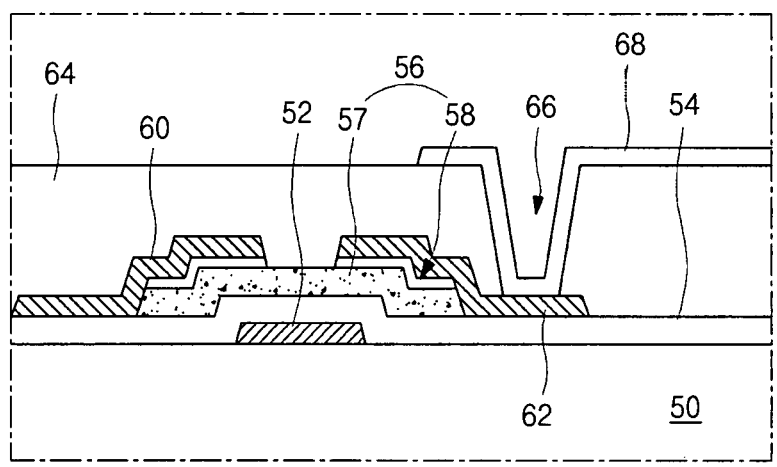
FIG. 2 is a cross-sectional view illustrating an LCD device having an inverted staggered type thin film transistor according to the related art.
Figure 3A:
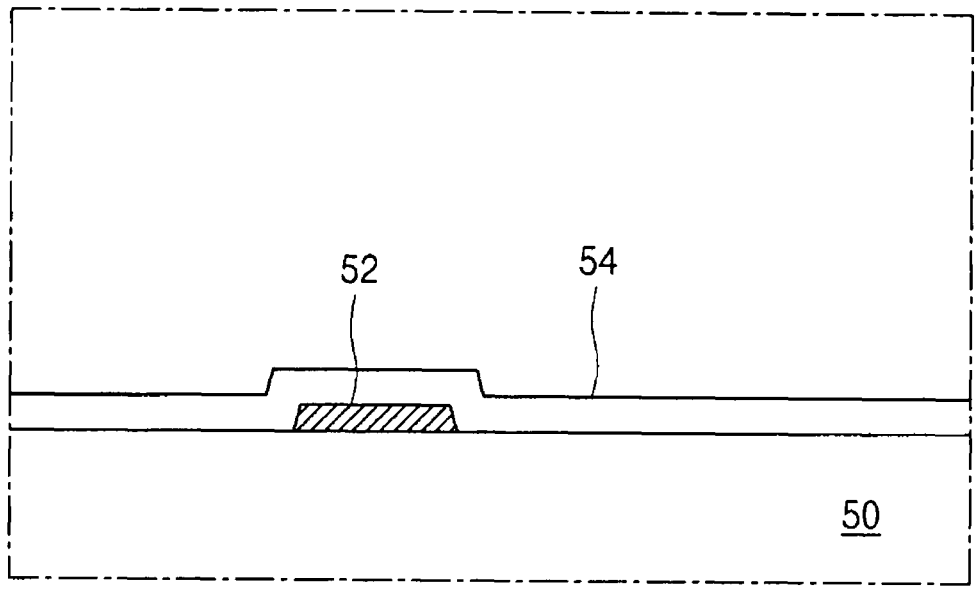
FIGS. 3A to 3E are cross-sectional views illustrating a method of fabricating an array substrate having an inverted staggered type thin film transistor according to the related art.
Figure 3B:
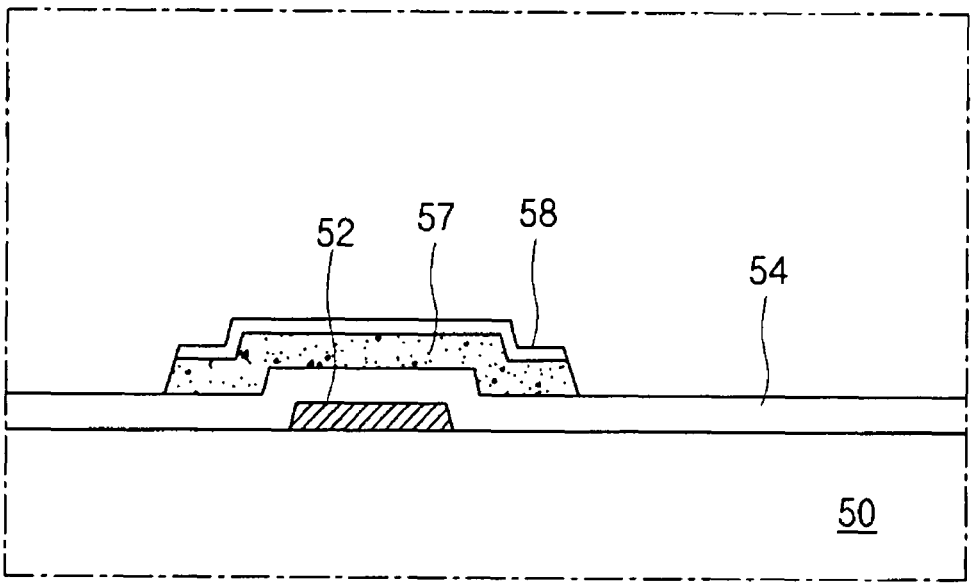
Figure 3C:
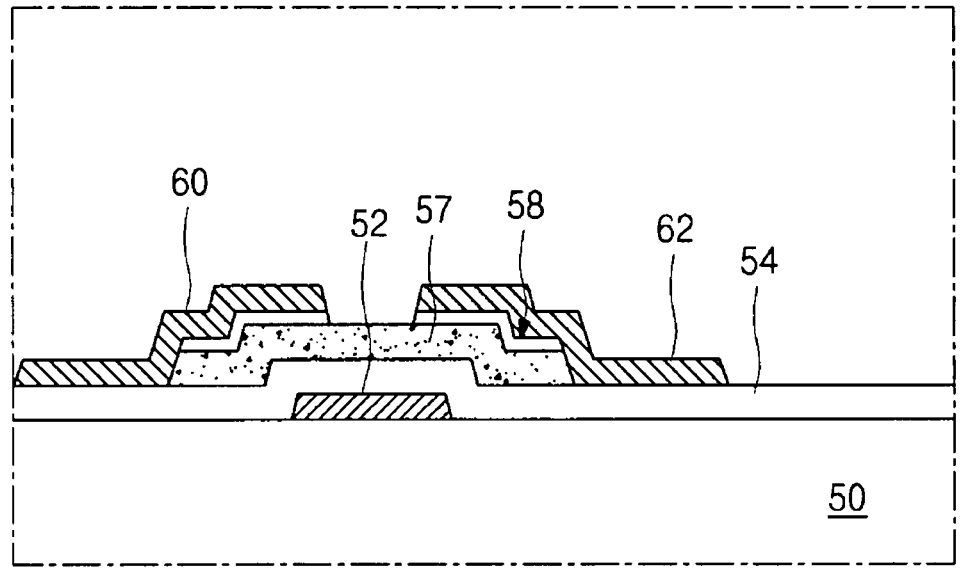
Figure 3D:
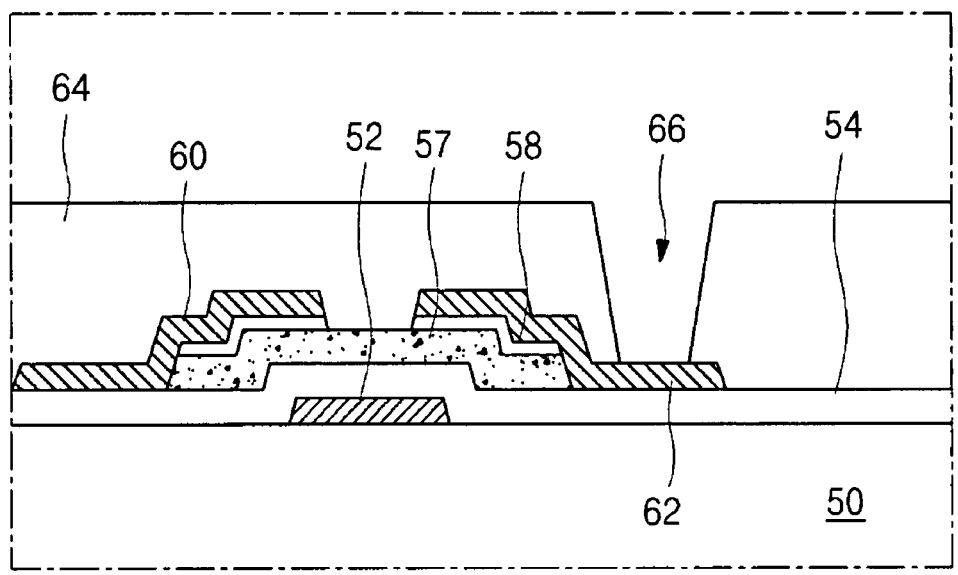
Figure 3E:
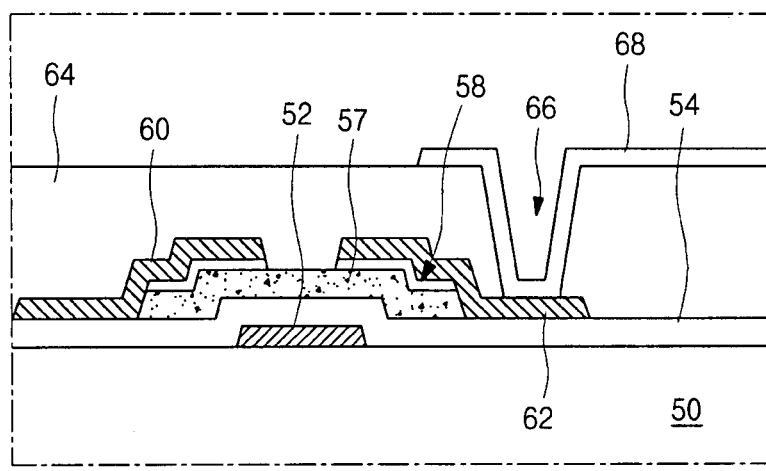
Figure 4:
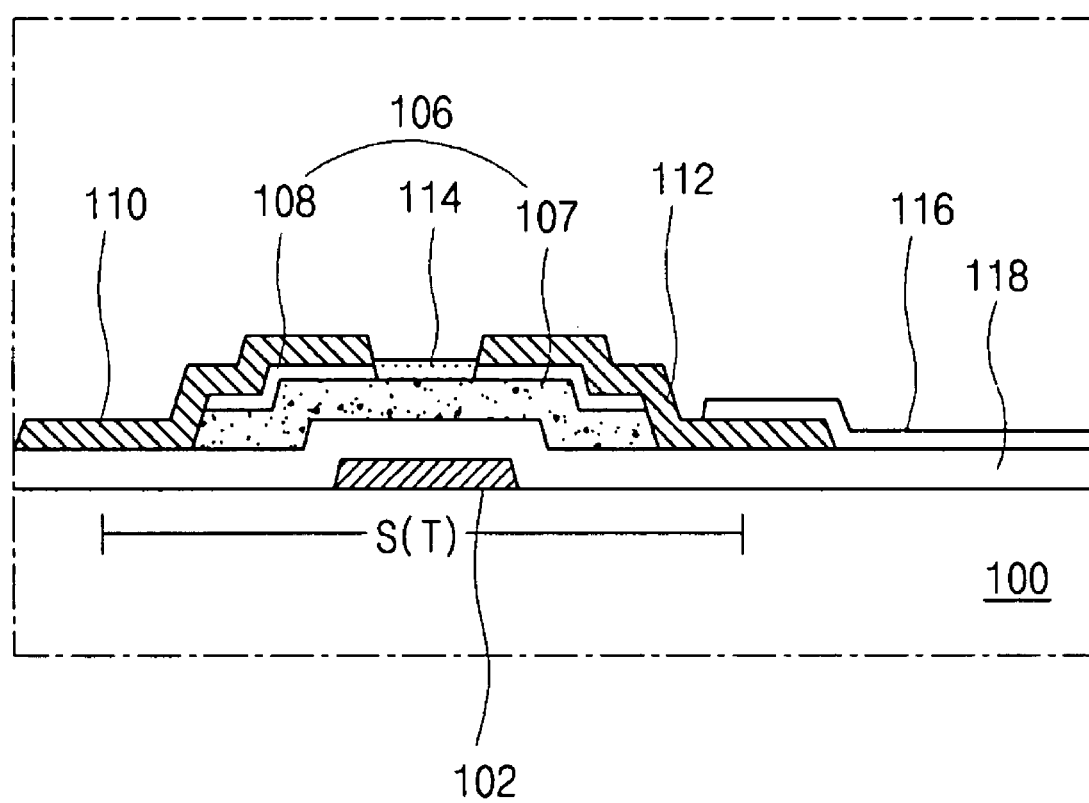
FIG. 4 is a cross-sectional view illustrating an array substrate for an LCD device according to an embodiment of the present invention.

FIG. 4 is a cross-sectional view illustrating an array substrate for an LCD device according to an embodiment of the present invention. Referring to FIG. 4, a thin film transistor T of an inverted staggered type in a switching region S includes a gate electrode 102 on a substrate 100, a semiconductor layer 106 over the gate electrode 102, and source and drain electrodes 110 and 112 spaced apart from each other. A pixel electrode 116 is formed on gate insulating layer 118 and contacts the drain electrode 1 12. The semiconductor layer 106 includes an active layer 107 and an ohmic contact layer 108. A channel portion of the active layer 107, which is between the ohmic contact layer 108 or the source and drain electrodes 110 and 112, is covered by a passivation layer 114.

The passivation layer 114 may be formed in the same chamber as that used to dry-etch a portion of the ohmic contact layer 108 between the source electrode 110 and drain electrode 112. In more detail, the portion of the ohmic contact layer 108 is etched in a vacuum chamber of a dry-etching device. A residual gas in the chamber is exhausted with the substrate 100 remaining in the chamber after etching the portion of the ohmic contact layer 108, and the chamber is made under a high vacuum condition. Then, a reaction gas for forming the passivation layer 114 flows in the chamber, and the passivation layer 114 is formed to cover the channel portion of the active layer 108 with a chemical vapor deposition method.

The portion of the ohmic contact layer 108 is removed as follows. Sulfur hexafluoride ($SF_6$) flows in the chamber and is treated in a plasma state, and thus fluoro-radical (F radical) is generated. The fluoro-radical reacts with silicon of the ohmic contact layer 108 and volatile silicon tetrafluoride ($SiF_4$) is formed. Through such a chemical reaction, the portion of the ohmic contact layer 108 is removed and the channel portion of the active layer 107 is exposed. After removing the portion of the ohmic contact layer 108, one of silicon nitride (SiNix) and silicon oxide ($SiO_2$) is formed on the channel portion with the substrate remaining in the chamber to form the passivation layer 114.

As described above, removing the portion of the ohmic contact layer 108 and forming the passivation layer 114 that covers the exposed channel portion is conducted in the same chamber with the substrate remaining in the chamber. Accordingly, the channel portion is not contaminated by external particles, and thus leakage current of the thin film transistor can be minimized.

Figure 5:
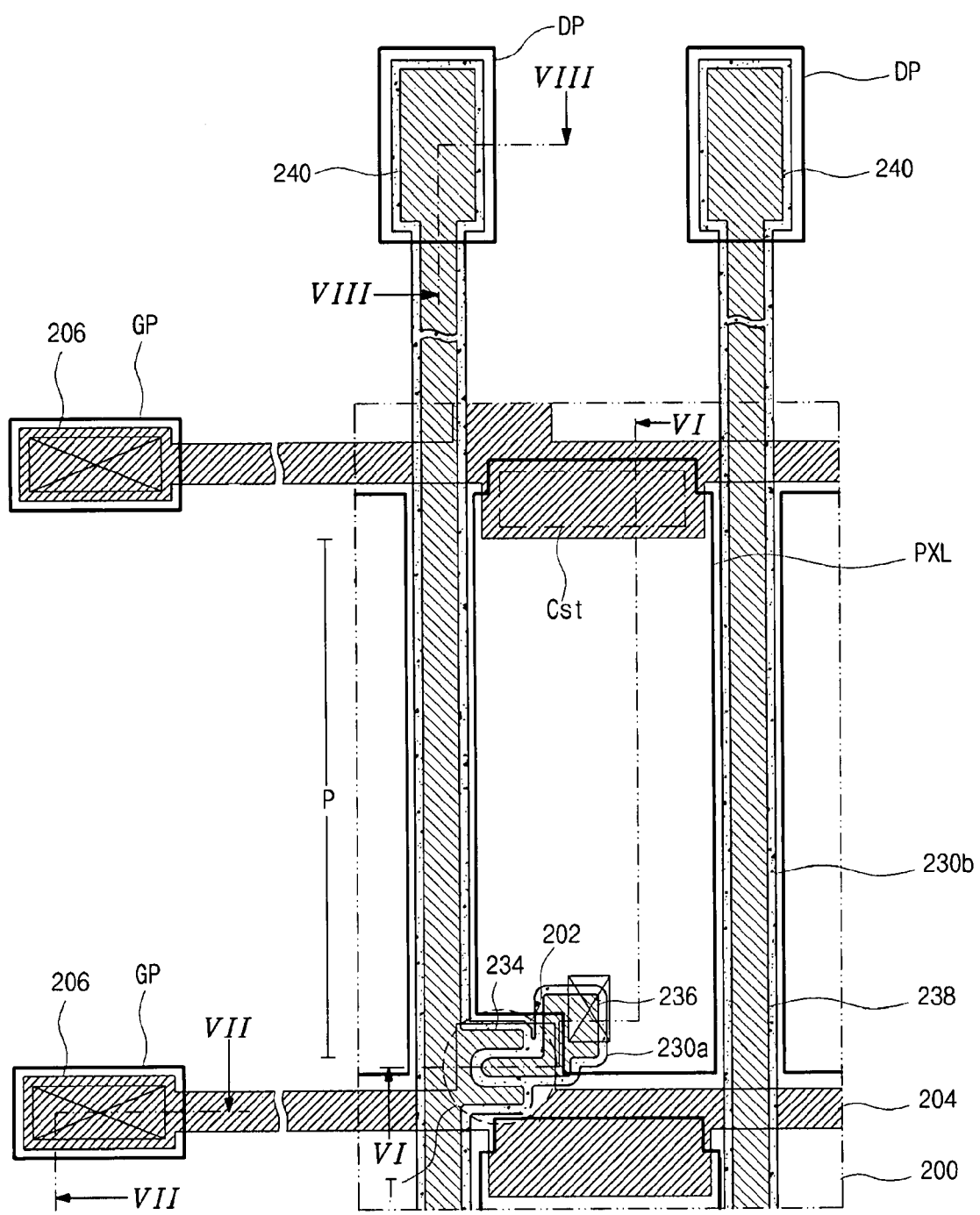
FIG. 5 is a plan view illustrating an array substrate for an LCD device according to another embodiment of the present invention.

FIG. 5 is a plan view illustrating an array substrate for an LCD device according to another embodiment of the present invention. The array substrate 200 of FIG. 5 is fabricated with four mask processes. Referring to FIG. 5, in the array substrate 200, a gate line 204 and a data line 238 cross each other to define a pixel region P. A gate pad 206 is disposed at one end of the gate line 204, and a data pad 240 is disposed at one end of the data line 238. A gate pad electrode GP is disposed on and contacts the gate pad 206, and a data pad electrode DP is disposed on and contacts the data pad 240.

An inverted staggered type thin film transistor T is near a crossing portion of the gate line 204 and data line 238. The thin film transistor T includes a gate electrode 202, a first semiconductor layer 230a over the gate electrode 202, and source and drain electrodes 234 and 236 on the first semiconductor layer 230a. A pixel electrode PXL is in the pixel region P and contacts the drain electrode 236. A second semiconductor layer 230b is below the data line 238 and extends from the first semiconductor layer 230a.

A storage capacitor Cst may be formed at a portion of the gate line 204. The portion of the gate line 204 may act as a first capacitor electrode, and a portion of the pixel electrode PXL overlapping the portion of the gate line 204 may act as a second capacitor electrode.

Figure 6A:
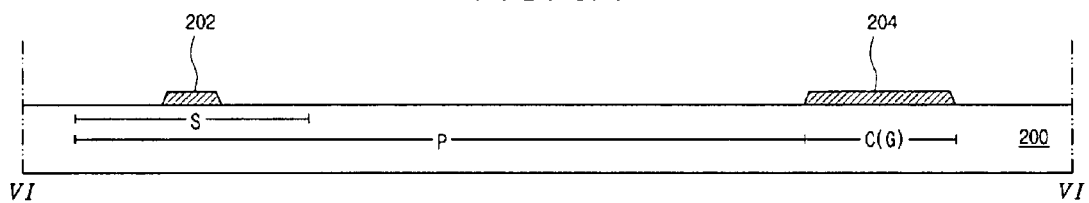
FIGS. 6A to 6G are cross-sectional views, taken along line VI-VI of FIG. 5 illustrating a method of fabricating the array substrate.

FIGS. 6A to 6G, 7A to 7G, and 8A to 8G are cross-sectional views, taken along lines VI-VI, VII-VII, and VIII-VIII, respectively, illustrating a method of fabricating the array substrate of FIG. 5. Referring to FIGS. 6A, 7A, and 8A, a metallic material is deposited on a substrate 200 having a switching region S, a pixel region P, a gate region G, a data region D and a storage region C. The metallic material is patterned with a first mask process to form a gate electrode 202 in a switching region S, and a gate line 204 and a gate pad 206 in a gate region G. A portion of the gate line 204 may be in the storage region C. The metallic material includes aluminum (Al), aluminum alloy (AlNd), tungsten (W), chromium (Cr), and molybdenum (Mo). At least two of such the materials may be used to form at least a two layered structure, for example, aluminum/chromium or molybdenum (Al/Cr or Al/Mo).

Figure 6B:
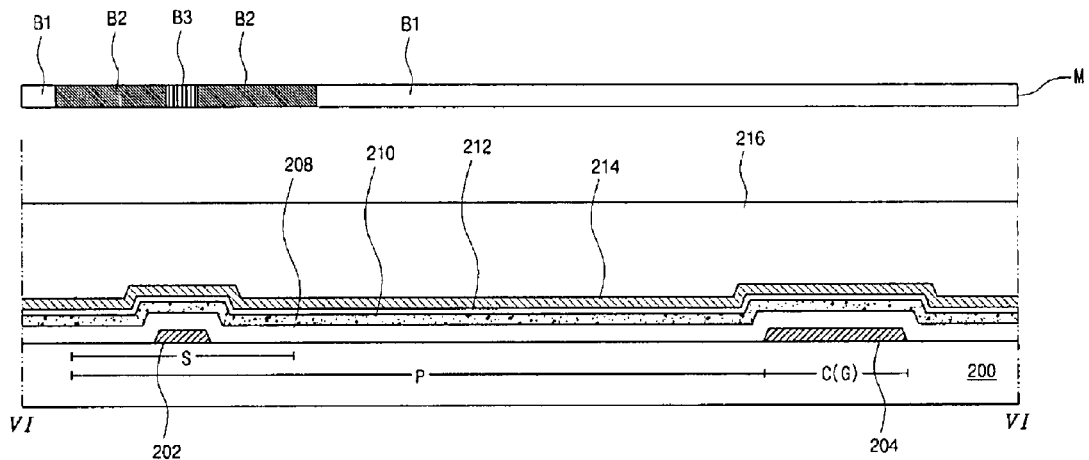
Figure 7A:
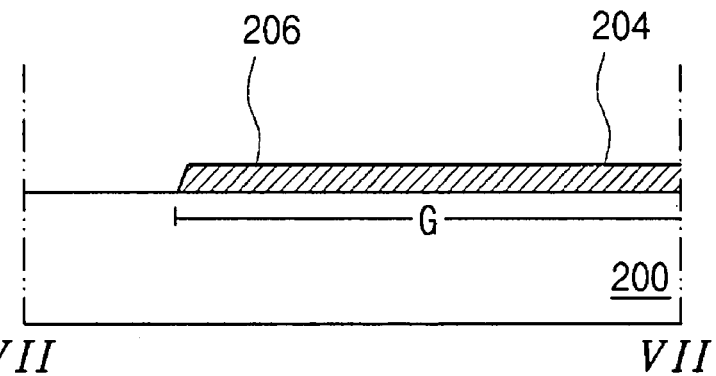
Figure 7B:
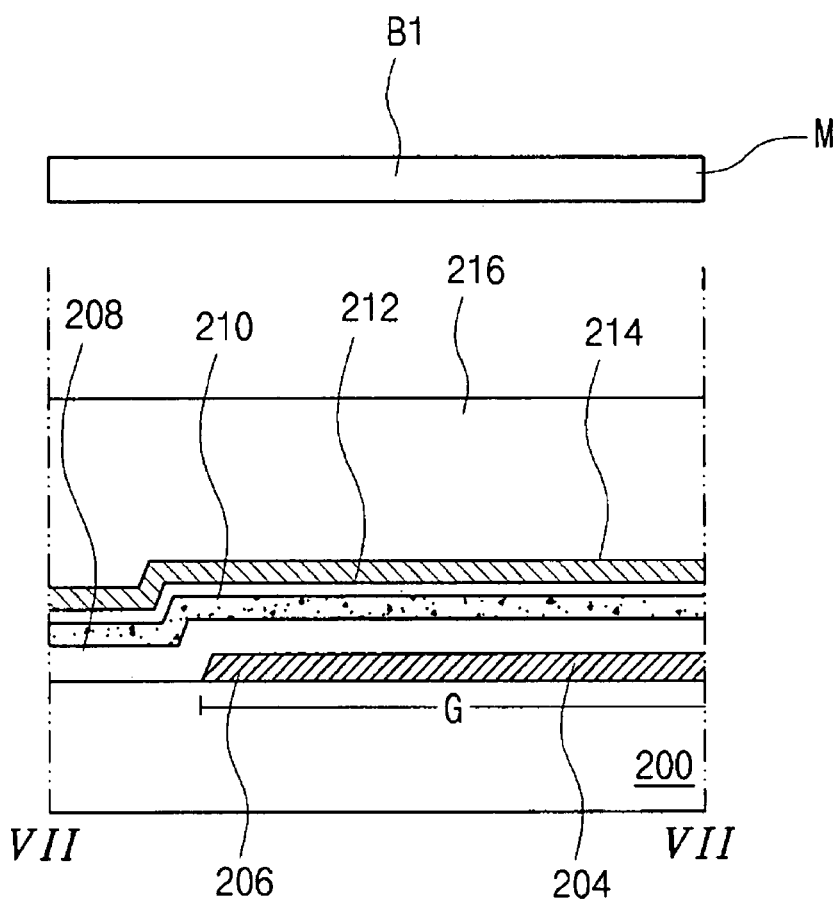
Figure 8A:
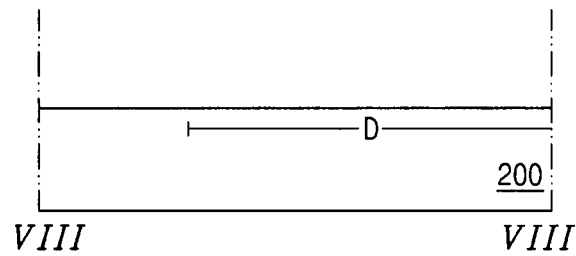
FIGS. 8A to 8G are cross-sectional views, taken along lines VIII-VIII of FIG. 5 illustrating a method of fabricating the array substrate.
Figure 8B:
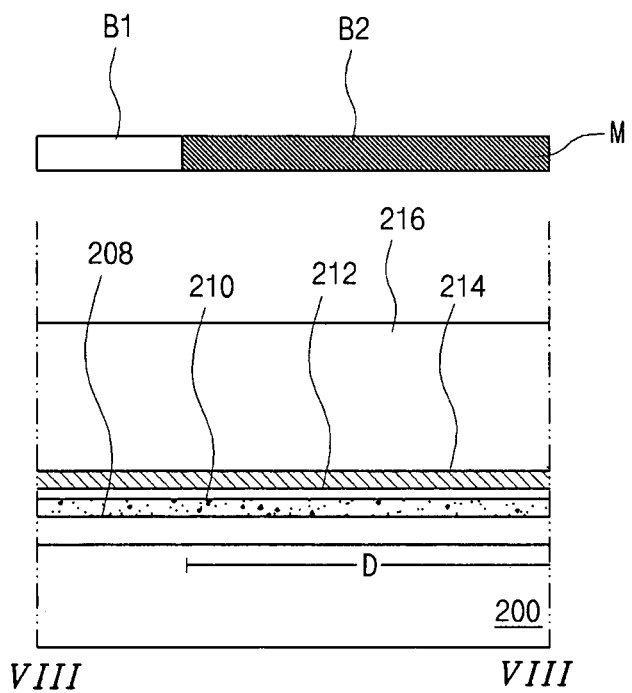

Referring to FIGS. 6B, 7B, and 8B, a gate insulating layer 208, an intrinsic amorphous silicon layer (a-Si:H) 210, an impurity-doped amorphous silicon layer (n+ or p+ a-Si:H) 212, and a metal layer 214 are sequentially formed on the substrate 200 having the gate electrode 202.

The gate insulating layer 208 includes an inorganic insulating material such as silicon nitride (SiNx) and silicon oxide ($SiO_2$), and an organic insulating material such as benzocyclobutene (BCB) and acrylic resin. The metal layer 214 includes aluminum (Al), aluminum alloy (AlNd), tungsten (W), chromium (Cr), and molybdenum (Mo). At least two of such the materials may be used to form at least a two layered structure, for example, aluminum/chromium or molybdenum (Al/Cr or Al/Mo).

A photoresist layer 216 is formed on the metal layer 214. A mask M is disposed over the photoresist layer 216. The mask M includes a transmitting portion B1, a blocking portion B2, and a semi-transmitting portion B3. The semi-transmitting portion B3 may include a semi-transmitting film or slit patterns to reduce light intensity such that it is less than the transmitting portion B1 and more than the blocking portion B2. The photoresist layer 216 may be a positive type.

The semi-transmitting portion B3 corresponds to a part of the switching region S. For example, at least a part of the gate electrode 202 corresponds to the semi-transmitting portion B3. The blocking portion B2 is disposed at both sides of the semi-transmitting portion B3. The blocking portion B2 is disposed at the data region D, for example, at both sides of the pixel region P. The transmitting portion B1 corresponds to the pixel region P and the gate region G. The photoresist layer 216 is exposed to light using the mask M and developed.

Figure 6C:
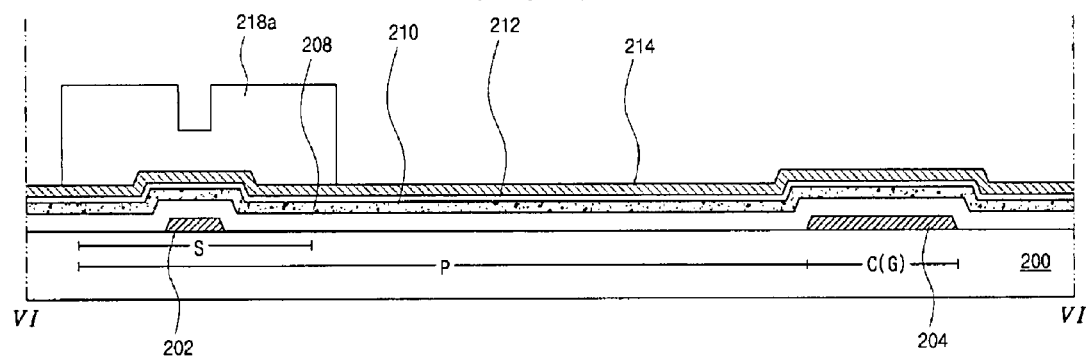
Figure 7C:
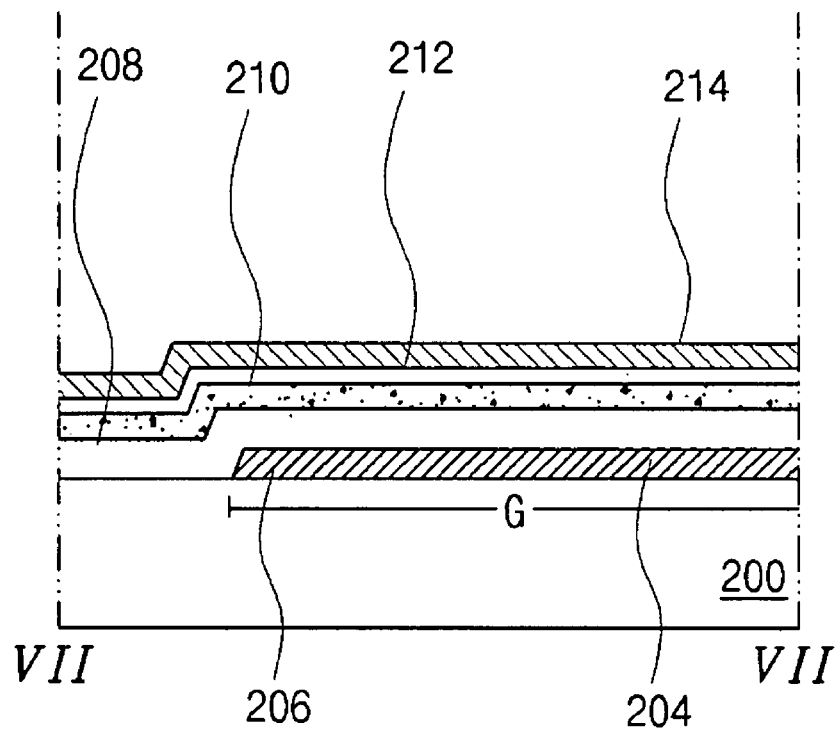
Figure 8C:
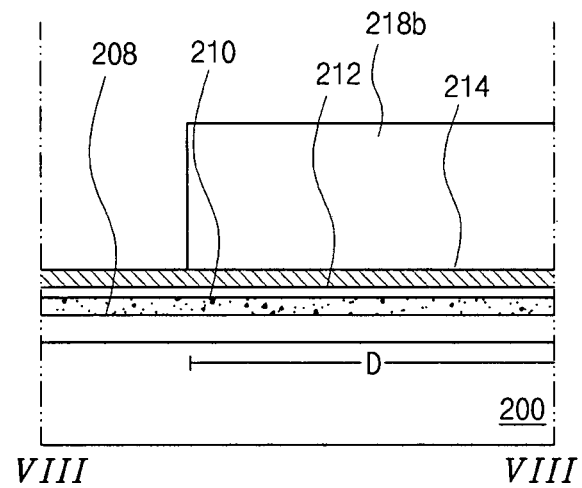

Referring to FIGS. 6C, 7C, and 8C, by the exposing and developing, first and second photoresist patterns 218a and 218b are formed at the switching region S and the data region D. A portion of the first photoresist pattern 218a corresponding to the semi-transmitting portion (B3 of FIG. 6B) of the mask (M of FIG. 6B) has a thickness lower than other portions of the first photoresist pattern 218a corresponding to the blocking portion (B2 of FIG. 6B) of the mask. A first etching of the metal layer 214, the impurity-doped amorphous silicon layer 212, and the intrinsic amorphous silicon layer 210 is conducted using the first and second photoresist patterns 218a and 218b. When etching the layers, based on an etching property of the metal layer 214, the silicon layers 212 and 210 may be etched simultaneously with the metal layer 214, or the silicon layers 212 and 210 may be dry-etched after etching the metal layer 214.

Figure 6D:
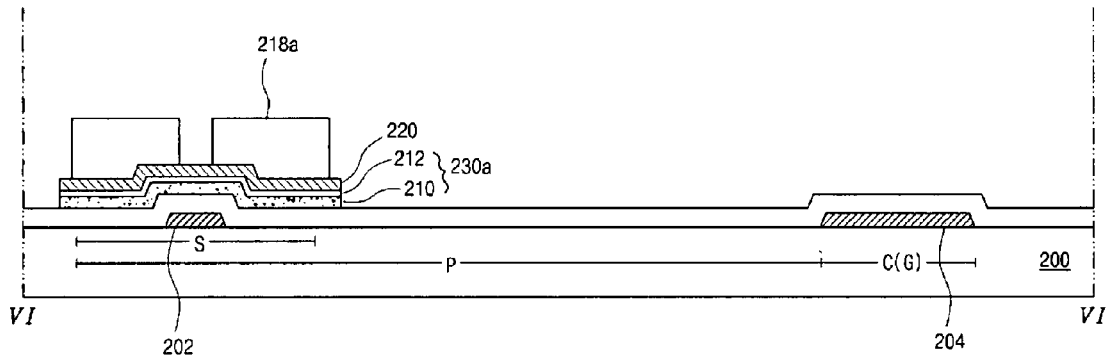
Figure 7D:
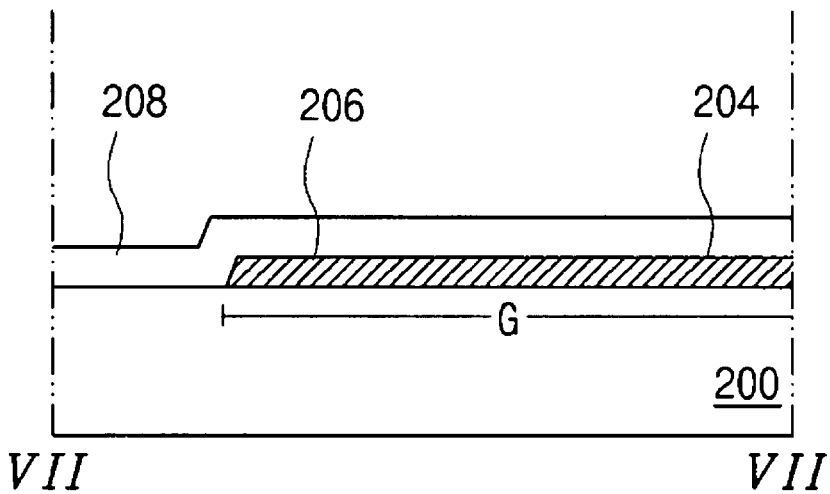
Figure 8D:
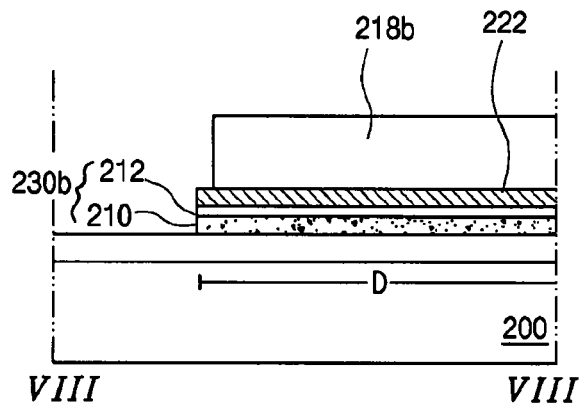

Referring to FIGS. 6D, 7D, and 8D, by the first etching, a first metal pattern 220 and a first semiconductor pattern 230a are formed below the first photoresist pattern 218a, and a second metal pattern 222 and a second semiconductor pattern 230b are formed below the second photoresist pattern 218b. Each of the first and second semiconductor patterns 230a and 230b includes the patterned intrinsic amorphous silicon layer 210 and impurity-doped amorphous silicon layer 212. An ashing of the first and second photoresist patterns 218a and 218b is conducted until the portion of the first photoresist pattern 218a having the lower thickness is removed. During the ashing, side portions of the first and second photoresist patterns 218a and 218b are removed, and thickness of the first and second photoresist patterns 218a and 218b are reduced. A second etching of the first and second metal patterns 220 and 222 and the impurity-doped amorphous silicon layer 212 of the first and second semiconductor patterns 230a and 230b is conducted using the ashed first and second photoresist patterns 218a and 218b.

Figure 6E:
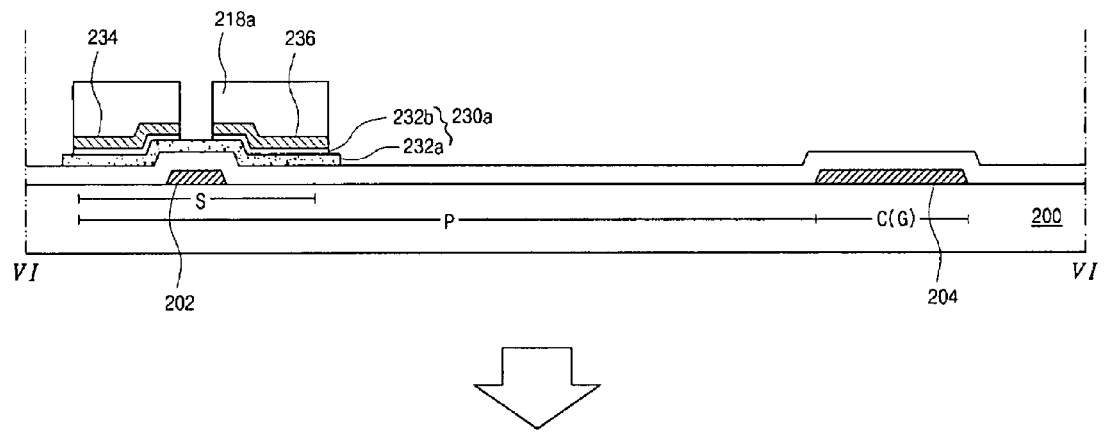
Figure 6E:
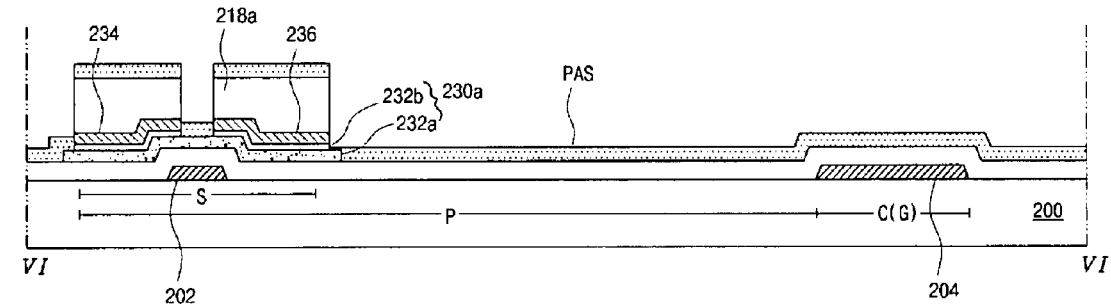
Figure 8E:
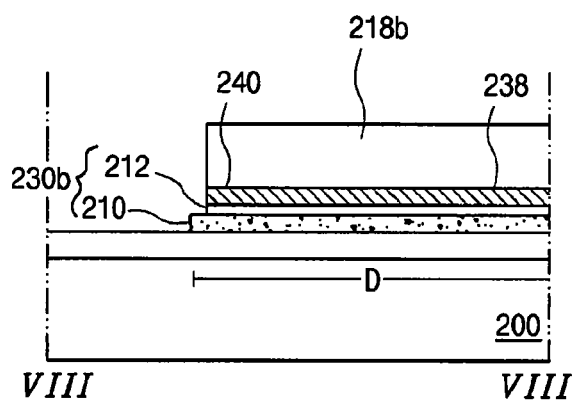
Figure 8E:
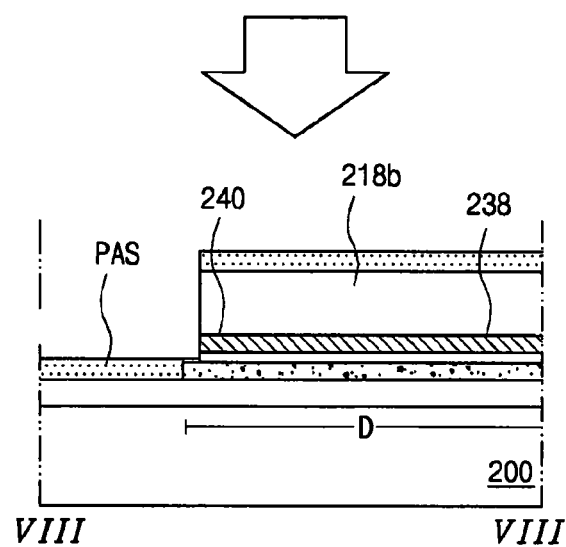

Referring to FIGS. 6E, 7E, and 8E, by the second etching, the first and second metal patterns (220 of FIG. 6D and 222 of FIG. 8D) and the impurity-doped amorphous silicon layer 212 of the first and second semiconductor patterns 230a and 230b, which are not covered by the ashed first and second photoresist patterns 218a and 218b, are removed to form source and drain electrodes 234 and 236 spaced apart from each other below the ashed first photoresist 218a, and to form a data line 238 and a data pad 240 below the ashed second photoresist pattern 218b. The first and second semiconductor patterns 230a and 230b are referred to as first and second semiconductor layers 230a and 230b.

The impurity-doped amorphous silicon layer 212 of the first semiconductor layer 230a is referred to as an ohmic contact layer 232b, and the intrinsic amorphous silicon layer 210 of the first semiconductor layer 230a is referred to as an active layer 232a. The active layer 232a may be partially removed in the second etching to remove impurities that may remain thereon.

In more detail of the second etching, the first and second metal patterns are etched to form the source and drain electrodes 234 and 236 and the data line 238. Then, the array substrate 200 is placed in a vacuum chamber of a dry-etching device. A dry-etching gas, for example, sulfur hexafluoride ($SF_6$) flows in the chamber to remove a portion of the ohmic contact layer 232b exposed between the source and drain electrodes 234 and 236. Then, the array substrate 200 still remains in the chamber and the gas in the chamber is exhausted.

Then, a reaction gas flows in the chamber to form a passivation layer PAS by chemical reaction. The reaction gas may include silane ($SiH_4$), ammonium ($NH_3$), and oxygen ($O_2$), and the passivation layer includes silicon nitride (SiNx) and silicon oxide ($SiO_2$).

The passivation layer PAS may be formed on the entire substrate where the first and second photoresist patterns 218a and 218b remain. Accordingly, the passivation layer PAS covers portions of the substrate between the source electrode 234, the drain electrode 236, and the data line 238. In other words, the passivation layer PAS completely covers a channel portion of the active layer 232a. Further, the passivation layer PAS is formed on the first and second photoresist patterns 218a and 218b. After forming the passivation layer PAS, the first and second photoresist patterns 218a and 218b may be removed by a lift-off method, and thus the passivation layer PAS on the first and second patterns 218a and 218b is removed. Accordingly, the source and drain electrodes 234 and 236, and the data line 238 are exposed.

As described above, because removing the portion of the ohmic contact layer 232b and forming the passivation layer PAS that covers the channel portion are conducted in the same chamber, the channel portion is not exposed to an external condition. Accordingly, the channel portion is not contaminated by external particles, and thus leakage current of the thin film transistor can be minimized. Through the above processes of FIGS. 6B to 6E, 7B to 7E, and 8B to 8E, a second mask process is conducted.

Figure 6F:
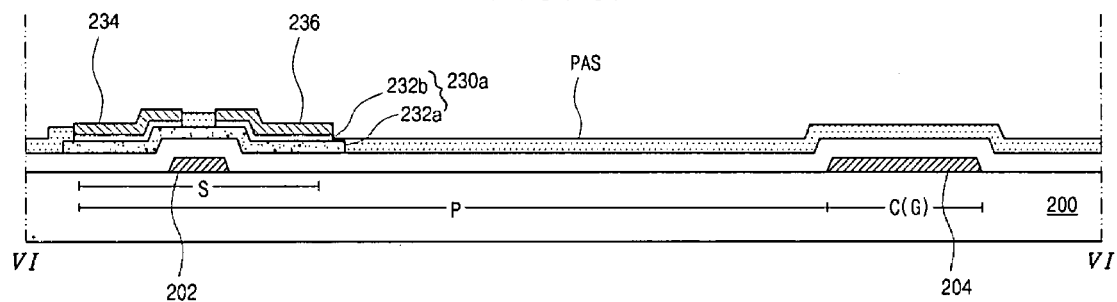
Figure 8F:
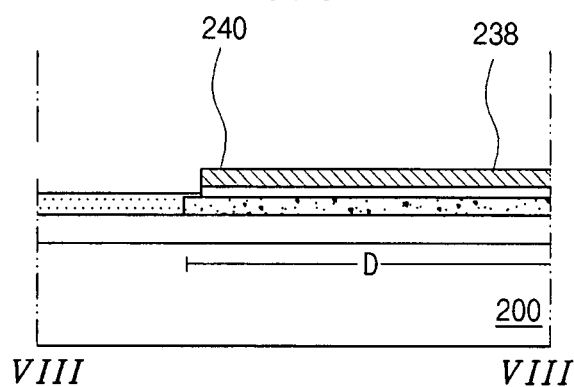

Referring to FIGS. 6F, 7F, and 8F, a portion of the passivation layer PAS and a portion of the gate insulating layer 208 over the gate pad 206 are patterned with a third mask process to form a gate pad contact hole CH.

Figure 6G:
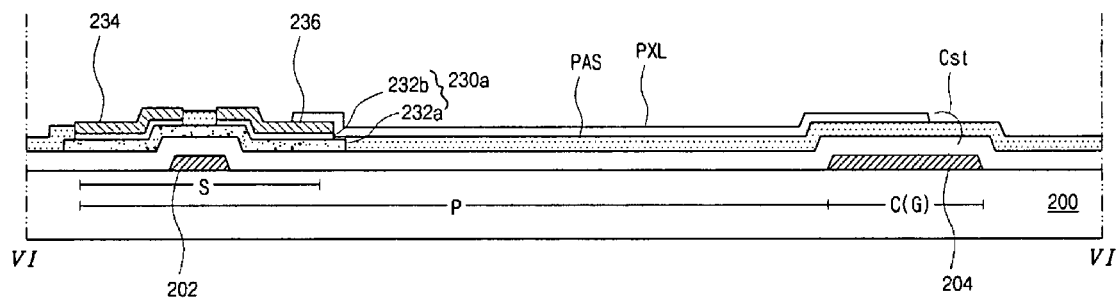
Figure 7G:
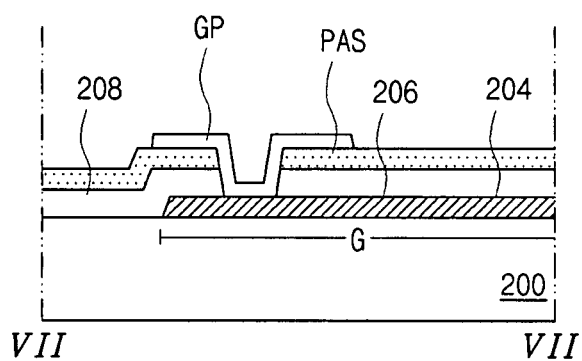
Figure 8G:
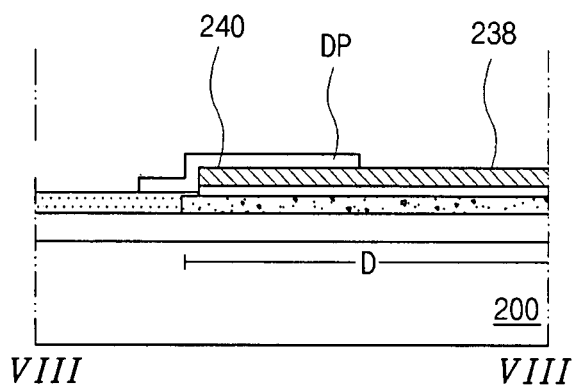

Referring to FIG. 6G, 7G, and 8G, a transparent conductive material is deposited on the substrate 200 having the passivation layer PAS and patterned with a fourth mask process to form a pixel electrode PXL contacting the drain electrode 236, a gate pad electrode GP contacting the gate pad 206 through the gate pad contact hole CH, and a data pad electrode DP contacting the data pad 240. The pixel electrode PXL may extend over the gate line 204 to form a storage capacitor Cst. The transparent conductive material includes indium-tin-oxide (ITO), indium-zinc-oxide (IZO), and indium-tin-zinc-oxide (ITZO).

Through the above four mask processes, the array substrate can be fabricated. The array substrate and the color filter substrate are attached with a liquid crystal layer interposed therebetween to complete the LCD device.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:

1. A method of fabricating a liquid crystal display device, comprising the steps of:
   forming a gate electrode and a gate line on a first substrate;
   forming a gate insulating layer on the gate electrode;
   forming an active layer on the gate insulating layer and an ohmic contact layer on the active layer;
   forming source and drain electrodes spaced apart from each other and on the ohmic contact layer;
   forming a data line that crosses the gate line;
   etching a portion of the ohmic contact layer between the source and drain electrodes in a chamber of a dry-etching device to expose a portion of the active layer;
   forming a passivation layer on the first substrate which remains in the chamber, the passivation layer covering the portion of the active layer;
   forming a pixel electrode connected to the drain electrode; and
   interposing a liquid crystal layer between the pixel electrode and a second substrate,
   wherein the passivation layer does not overlap the source and drain electrodes, and
   wherein a portion of the passivation layer directly below the pixel electrode does not overlap the drain electrode.

2. The method according to claim 1, wherein etching the portion of the ohmic contact layer includes the steps of:
   flowing an etching gas in the chamber; and
   treating the etching gas in a plasma state to form a radical that reacts with the portion of the ohmic contact layer to form a volatile gas.

3. The method according to claim 2, wherein the etching gas includes sulfur hexafluoride ($SF_6$), and the active layer and the ohmic contact layer include silicon.

4. The method according to claim 2, wherein forming the passivation layer includes the steps of:
   exhausting residual gases in the chamber after etching the portion of the ohmic contact layer; and
   flowing a reaction gas in the chamber to form the passivation layer.

5. The method according to claim 4, wherein the reaction gas includes silane ($SiH_4$), ammonium ($NH_3$), and oxygen ($O_2$).

6. The method according to claim 1, wherein forming the active layer, the ohmic contact layer, the source and drain electrodes, and the data line are formed with a mask.

7. The method according to claim 6, wherein the active layer and the ohmic contact layer extend below the data line.

8. The method according to claim 7, wherein forming the active layer, the ohmic contact layer, the source and drain electrodes, and the data line includes the steps of:
   forming an intrinsic amorphous silicon layer, an impurity-doped amorphous silicon layer, and a metal layer;
   forming first and second photoresist patterns on the metal layer with the mask, the first photoresist pattern having a portion which has a thickness less than an other portion; and
   patterning the metal layer, the impurity-doped amorphous silicon layer, and the intrinsic amorphous silicon layer using the first photoresist pattern to form the active layer, the ohmic contact layer, and the source and drain electrodes and using the second photoresist pattern to form the data line, wherein the active layer is made of the intrinsic amorphous silicon layer and the ohmic contact layer is made of the impurity-doped amorphous silicon layer.

9. The method according to claim 8, wherein forming the first and second photoresist patterns includes the steps of:
   forming a photoresist layer on the metal layer;
   exposing the photoresist layer to light using the mask having a transmitting portion, a semi-transmitting portion, and a blocking portion; and
   developing the photoresist layer, wherein the portion of the first photoresist pattern having the thickness less than the other portion corresponds to the semi-transmitting portion.

10. The method according to claim 8, wherein patterning the metal layer, the impurity-doped amorphous silicon layer, and the intrinsic amorphous silicon layer includes the steps of:
   first-etching the metal layer, the impurity-doped amorphous silicon layer, and the intrinsic amorphous silicon layer using the first and second photoresist patterns;
   ashing the first and second photoresist patterns to remove the portion of the first photoresist pattern having the thickness less than the other portion; and second-etching the first-etched metal layer and impurity-doped amorphous silicon layer using the ashed first and second photoresist patterns.

11. The method according to claim 10, wherein the ashed first and second photoresist patterns remain during forming the passivation layer.

12. The method according to claim 11, wherein the ashed first and second photoresist patterns are removed by a lift-off method.

13. The method according to claim 1, further including the steps of:
    forming a gate pad in the same process of forming the gate line; and
    forming a data pad in the same process of forming the data line.

14. The method according to claim 13, further including the steps of:
    forming a gate pad contact hole exposing the gate pad by patterning the passivation layer and the gate insulating layer over the gate pad.

15. The method according to claim 14, further including the step of forming a gate pad electrode and a data pad electrode in the same process of forming the pixel electrode, wherein the gate pad electrode contacts the gate pad and the data pad electrode contacts the data pad.

16. A method of fabricating a liquid crystal display device, comprising the steps of:
    forming a gate line and a data line crossing each other to define a pixel region on an array substrate;
    forming a thin film transistor on the array substrate connected to the gate line and the data line and including a gate electrode, an active layer over the gate electrode, an ohmic contact layer on the active layer, and source and drain electrodes on the ohmic contact layer, wherein a portion of the ohmic contact layer between the source and drain electrodes is etched in a chamber of a dry-etching device to expose a portion of the active layer;
    forming a passivation layer on the array substrate which remains in the chamber, the passivation layer covering the portion of the active layer;
    forming a pixel electrode in the pixel region; and
    attaching the array substrate and an opposing substrate with a liquid crystal layer between the array substrate and the opposing substrate,
    wherein the passivation layer does not overlap the source and drain electrodes, and
    wherein a portion of the passivation layer directly below the pixel electrode does not overlap the drain electrode.

17. The method according to claim 16, wherein the passivation layer is formed with a photoresist pattern remaining, the photoresist pattern being used to form the source and drain electrodes.

* * * * *